United States Patent
Arp et al.

(10) Patent No.: US 10,469,063 B2
(45) Date of Patent: *Nov. 5, 2019

(54) METHOD AND APPARATUS FOR CLOCK SKEW CONTROL WITH LOW JITTER IN AN INTEGRATED CIRCUIT

(71) Applicant: International Business Machines Corporation, Armonk, NY (US)

(72) Inventors: Andreas Arp, Nufringen (DE); Fatih Cilek, Boeblingen (DE); Andre Hertwig, Waldenbuch (DE); Michael Koch, Ehningen (DE); Matthias Ringe, Tuebingen (DE)

(73) Assignee: International Business Machines Corporation, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/361,985

(22) Filed: Mar. 22, 2019

(65) Prior Publication Data

US 2019/0222206 A1  Jul. 18, 2019

Related U.S. Application Data

(63) Continuation of application No. 16/037,697, filed on Jul. 17, 2018, which is a continuation of application No. 15/257,963, filed on Sep. 7, 2016, now Pat. No. 10,110,205.

(51) Int. Cl.
*H03H 11/26* (2006.01)
*H03K 5/05* (2006.01)
*G06F 1/10* (2006.01)

(52) U.S. Cl.
CPC .... *H03K 5/05* (2013.01); *G06F 1/10* (2013.01)

(58) Field of Classification Search
CPC .................................... H03K 5/05; G06F 1/10
USPC ......................................................... 327/270
See application file for complete search history.

(56) References Cited

U.S. PATENT DOCUMENTS

| | | | |
|---|---|---|---|
| 6,570,428 B1 | 5/2003 | Liao et al. | |
| 8,779,819 B1 | 7/2014 | Venditti | |
| 9,071,293 B1 | 6/2015 | Venditti et al. | |
| 9,219,470 B1 | 12/2015 | Venditti | |

(Continued)

OTHER PUBLICATIONS

List of IBM Patents or Patent Applications Treated as Related.

*Primary Examiner* — Metasebia T Retebo
(74) *Attorney, Agent, or Firm* — Scully, Scott, Murphy & Presser, P.C.; Steven Meyers, Esq.

(57) ABSTRACT

An apparatus of performing a clock skew adjustment between at least first and second clock signals includes first and second skew sensors and a skew controller. The first skew sensor receives a third clock signal obtained by delaying the first clock signal by a first delay and a fourth clock signal obtained by delaying the second clock signal by a second delay, and generates first information based on the third and fourth clock signals. The second skew sensor receives a fifth clock signal obtained by delaying the first clock signal by a third delay and a sixth clock signal obtained by delaying the second clock signal by a fourth delay, and generates second information based on the fifth and sixth clock signals. Each of the first and second information varies depending on the clock skew. The skew controller performs the clock skew adjustment based on the first and second information.

20 Claims, 11 Drawing Sheets

(56) References Cited

U.S. PATENT DOCUMENTS

2010/0237914 A1\* 9/2010 Katoh .................. G06F 1/10
                                                  327/149
2015/0372684 A1 12/2015 Francom et al.

\* cited by examiner

METHOD AND APPARATUS FOR CLOCK SKEW CONTROL WITH LOW JITTER IN AN INTEGRATED CIRCUIT

FIELD

The present disclosure generally relates to a clock skew adjustment technique, and more particularly, to a system of controlling a clock skew with low jitter and a method for operating the system.

BACKGROUND

In integrated circuits, a "clock skew" is a phenomenon which at least two clock signals, which may originate from, e.g., the same clock generation circuits arrives at different times.

Typically, as exemplary shown in FIG. 1, the clock skew adjustment within integrated circuits is performed with a simple skew sensor 20 which detects which one of two input clock signals Clk1' and Clk2' is later in time than or earlier than another. An algorithm for the clock skew control is to minimize the clock skew by delaying a fast clock signal of the two clock signals Clk1' and Clk2' or accelerating a slow clock signal thereof.

Referring to FIG. 1, the clock skew adjustment system 1 may receive clock signals Clk1'_in and Clk2'_in, delay the same through the delay units 30-1 and 30-2, respectively, by the delays of (D+ΔtA) and (D+ΔtB) for the clock skew adjustment, and output clock signals Clk1' and Clk2', between which clock skew has been adjusted, through nodes N1 and N2, respectively. The delayed output clock signals Clk1' and Clk2' are input to the skew sensor 20, and the skew sensor 20 may output a signal, as shown in Table 1 below, depending on a difference ΔT in arrival time between the two clock signals Clk1' and Clk2'.

| ΔT | Sensor Output |
|---|---|
| ΔT < −S | L0 |
| −S ≤ ΔT < S | Undeterministic state between L0 and L1 |
| ΔT ≥ S | L1 |

Here, 'S' denotes a sensor resolution (e.g., a threshold of differences of the arrival times of the clocks). When the clock skew ΔT is such that ΔT<−S, and ΔT≥S, the skew sensor 20 may output logic 0 L0 (e.g., logic low) and logic 1 L1 (e.g., logic high), respectively. However, when the clock skew ΔT is such that −S≤ΔT<S, which will be referred to as an "uncertainty region", the skew sensor 20 might not decide which one of the clock signals Clk1' and Clk2' is earlier than the other, outputting either of the logic 1 L1 or the logic 0 L0 in a random manner.

If the minimal step size of each delay unit 30-1 and 30-2 is larger than the uncertainty region of the skew sensor 20, the clock skew adjustment system 1 might not enter a steady state, jumping back and forth between two consecutive delay settings, and thus, jitters may occur on the clock signals.

Thus, there is a need for a clock skew adjustment technique to reduce jitter on clock signals while maintaining long-term stability.

SUMMARY

In one aspect, there is provided an apparatus of performing a clock skew adjustment between at least first and second clock signals. The apparatus includes a first skew sensor, a second skew sensor, and a clock skew controller. The first skew sensor is configured to receive a third clock signal obtained by delaying the first clock signal by a first delay and a fourth clock signal obtained by delaying the second clock signal by a second delay, and to generate first information based on the third and fourth clock signals. The first information varies depending on a clock skew between the first and second clock signals. The second skew sensor is configured to receive a fifth clock signal obtained by delaying the first clock signal by a third delay and a sixth clock signal obtained by delaying the second clock signal by a fourth delay, and to generate second information based on the fifth and sixth clock signals. The second information varies depending on the clock skew between the first and second clock signals. The clock skew controller is configured to perform the clock skew adjustment based on the first and second information.

In another aspect, there is provided a method for adjusting a clock skew between at least first and second clock signals. The method includes receiving, by a first skew sensor, third and fourth clock signals, receiving, by a second skew sensor, fifth and sixth clock signals. The third clock signal is obtained by delaying the first clock signal by a first delay. The fourth clock signal is obtained by delaying the second clock signal by a second delay. The fifth clock signal is obtained by delaying the first clock signal by a third delay. The sixth clock signal is obtained by delaying the second clock signal by a fourth delay. The method further includes generating, by the first skew sensor, first information based on the third and fourth clock signals, generating, by the second skew sensor, second information based on the fifth and sixth clock signals, and performing the clock skew adjustment based on the first and second information. Each of the first and second information varies depending on the clock skew between the first and second clock signals.

Further, in another aspect, there is provided a computer program product for a method of adjusting a clock skew between at least first and second clock signals. The computer program product is stored in a non-transitory computer-readable storage medium having computer readable program instructions. The computer readable program instructions are read and carried out by a processing device. The method includes receiving, by a first skew sensor, third and fourth clock signals, receiving, by a second skew sensor, fifth and sixth clock signals. The third clock signal is obtained by delaying the first clock signal by a first delay. The fourth clock signal is obtained by delaying the second clock signal by a second delay. The fifth clock signal is obtained by delaying the first clock signal by a third delay. The sixth clock signal is obtained by delaying the second clock signal by a fourth delay. The method further includes generating, by the first skew sensor, first information based on the third and fourth clock signals, generating, by the second skew sensor, second information based on the fifth and sixth clock signals, and performing the clock skew adjustment based on the first and second information. Each of the first and second information varies depending on the clock skew between the first and second clock signals.

DETAILED DESCRIPTION OF THE EMBODIMENTS

Figure 1:
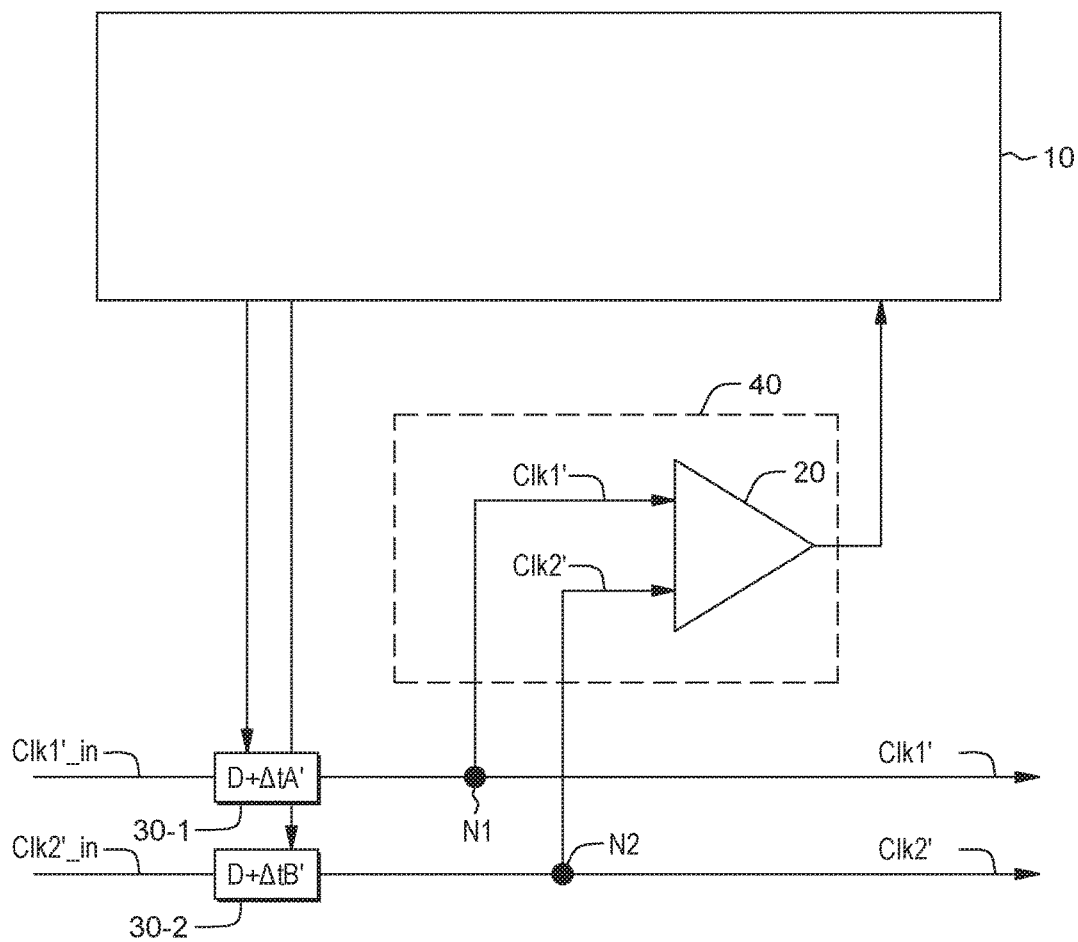
FIG. 1 illustrates an existing clock skew adjustment system.

Like reference numerals may refer to like elements throughout the written descriptions and drawings.

Figure 2A:
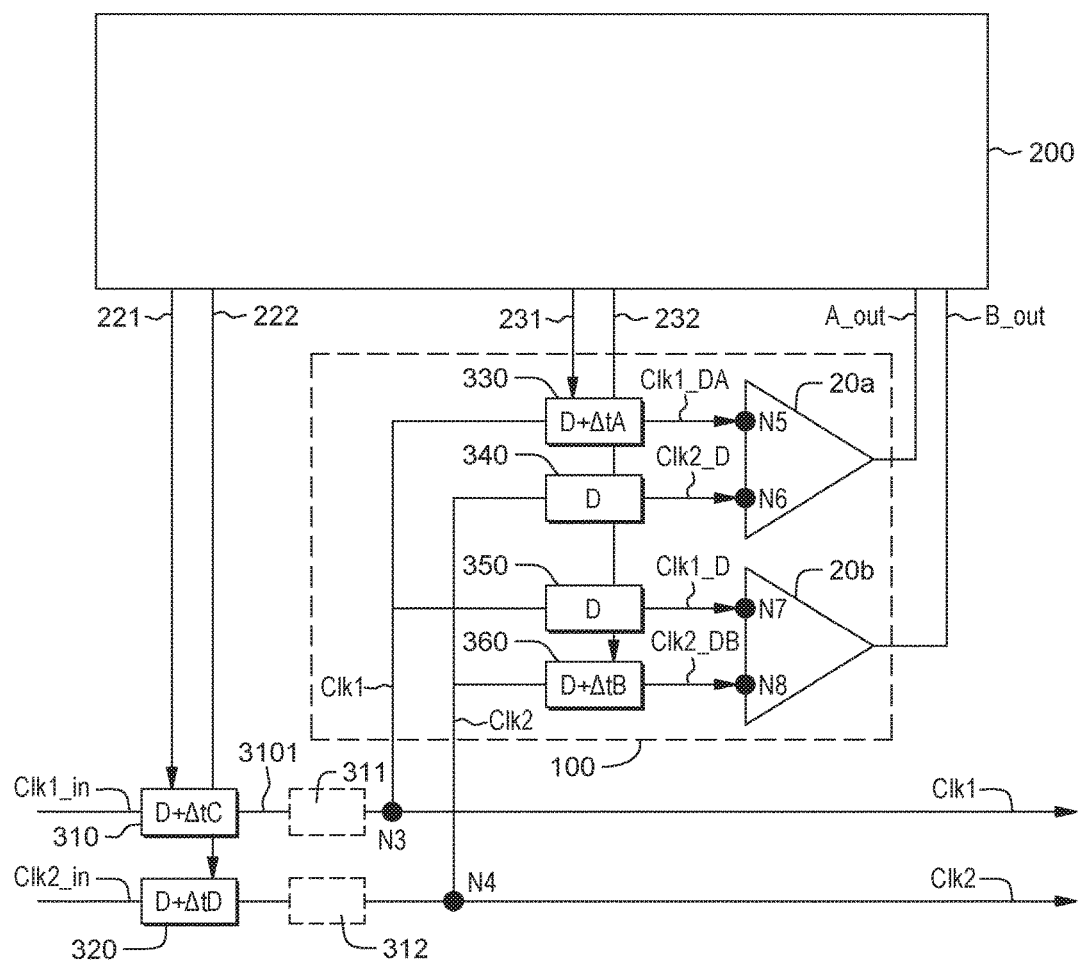
FIG. 2A illustrates a clock skew adjustment system according to a non-limiting exemplary embodiment of the present disclosure.
Figure 2B:
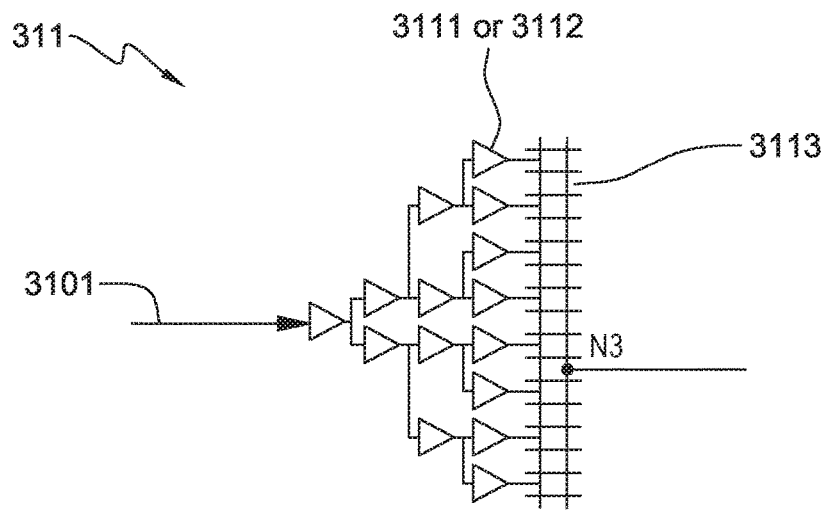
FIG. 2B illustrates an example of a circuit structure disposed between a delay unit and a skew sensing apparatus according to a non-limiting exemplary embodiment of the present disclosure.
Figure 2C:
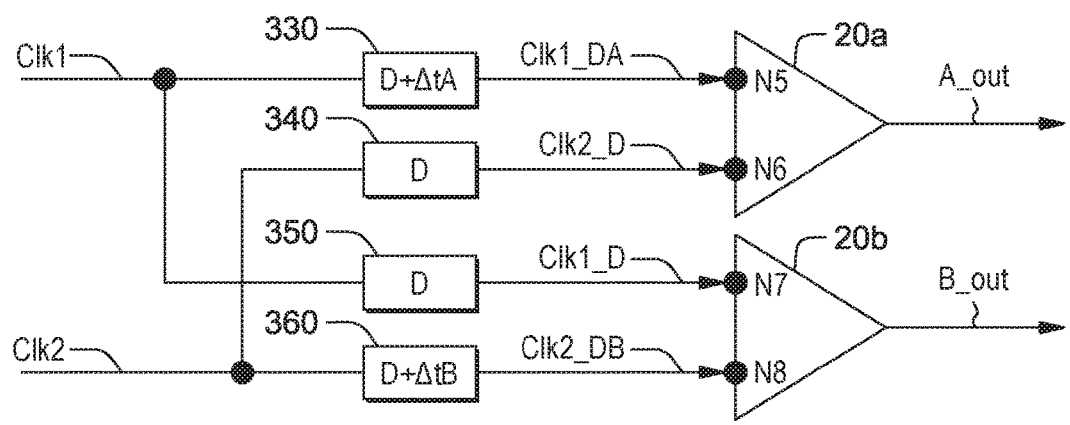
FIG. 2C illustrates a skew sensing apparatus of FIG. 2A according to a non-limiting exemplary embodiment of the present disclosure.
Figure 3A:
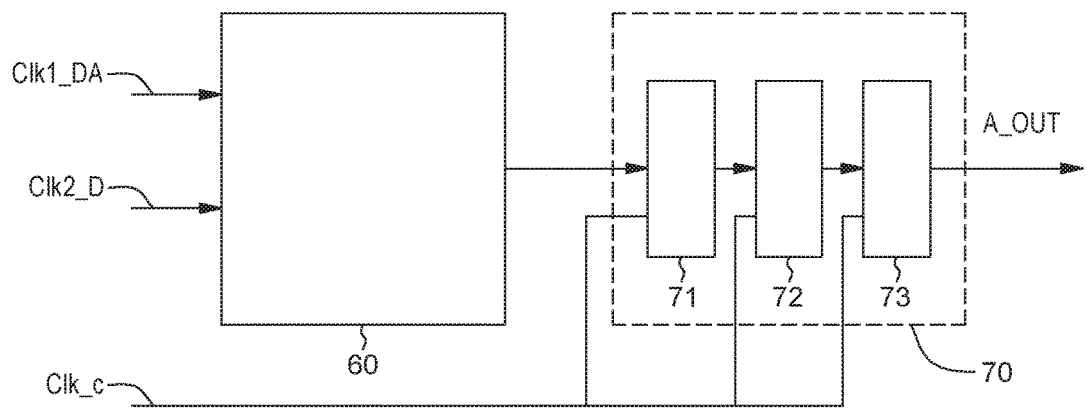
FIGS. 3A and 3B illustrate block diagrams of the respective first and second skew sensors in the skew sensor apparatus of FIG. 2A according to a non-limiting exemplary embodiment of the present disclosure.
Figure 3B:
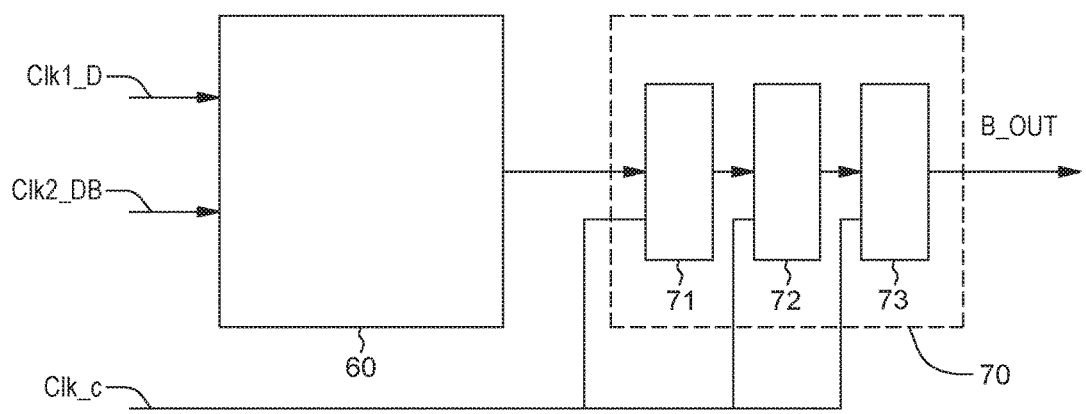
Figure 4:
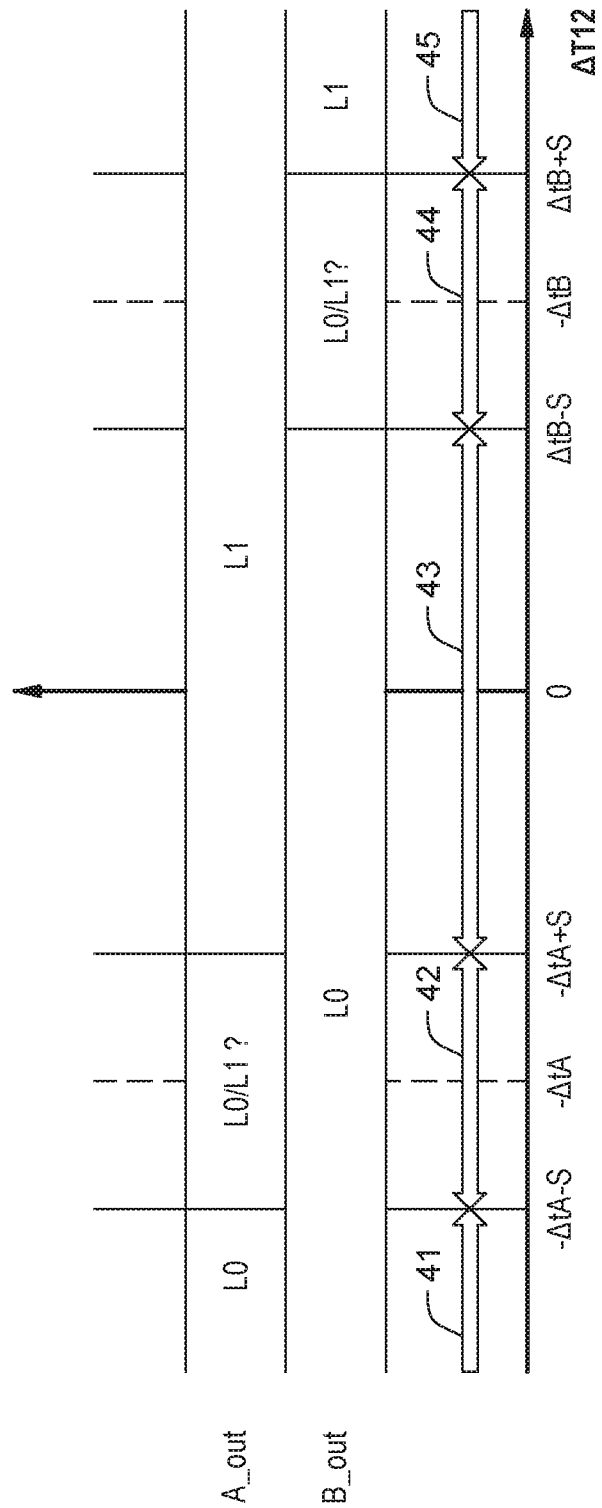
FIG. 4 illustrates outputs of the skew sensing apparatus of FIG. 2C depending on a clock skew between two clock signals according to a non-limiting exemplary embodiment of the present disclosure.

FIG. 2A illustrates a clock skew adjustment system 2 according to a non-limiting exemplary embodiment of the present disclosure. FIG. 2B illustrates an example of a circuit structure disposed between a delay unit and a skew sensing apparatus according to a non-limiting exemplary embodiment of the present disclosure. FIG. 2C illustrates a skew sensing apparatus 100 of FIG. 2A according to a non-limiting exemplary embodiment of the present disclosure. FIGS. 3A and 3B illustrates block diagrams of the respective first and second skew sensors 20a and 20b in the skew sensor apparatus 100 of FIG. 2A according to a non-limiting exemplary embodiment of the present disclosure. FIG. 4 illustrates outputs of the skew sensing apparatus 100 of FIG. 2C depending on a clock skew between two clock signals according to a non-limiting exemplary embodiment of the present disclosure.

Referring to FIG. 2A, the clock skew adjustment system 2 may include a skew sensing apparatus 100, a clock skew controller 200, and first and second delay units 310 and 320. The skew sensing apparatus 100 may include first and second skew sensors 20a and 20b, and the third to sixth delay units 330 to 360.

In an embodiment, each of the first to sixth delay units 310 to 360 may be implemented with various ways including wire delays using switchable different wire lengths, programmable delay circuits having active elements, or the like. However, exemplary embodiments of the present disclosure are not limited thereto. Throughout the present disclosure, "D" is a fixed value (e.g., in an ideal case, D=0), representing a minimum delay of each of the delay units 310 to 360.

The clock skew controller 200 may provide two skew control signals 221 and 222 to the first and second delay units 310 and 320, respectively, and two sensor control signals 231 and 232 to the third and sixth delay units 330 and 360, respectively.

The clock skew adjustment system 2 may receive clock signals Clk1_in and Clk2_in and output clock signals Clk1 and Clk2, between which a clock skew ΔT12 has been adjusted, through nodes N3 and N4, respectively. The clock signals Clk1 and Clk2 at the respective nodes N3 and N4 are also input to the delay units 330 to 360.

Thus, the clock signals Clk1_in and Clk2_in are input to the first and second delay units 310 and 320, respectively. The clock signal Clk1_in may be delayed through the first delay unit 310 by a first delay of (D+ΔtC) in response to the skew control signal 221, and provided to the third delay unit 330 and the fifth delay unit 350 via a node N3.

In one embodiment, an element 311 including circuits or other structures 311 may be disposed between the first delay unit 310 and the input of the skew sensing apparatus 100. The element 311 may be configured to distribute a clock signal, which corresponds to the clock signal Clk1, output from the delay unit 310 over various areas within an integrated circuit (IC) chip where the clock skew adjustment system 2 is applied. For example, the element 311 may include, but is not limited to, a buffer(s) 3111, an inverter(s) 3112 and/or other circuit elements such as a grid of wires 3113, as shown in FIG. 2B. The connections among the buffer(s) 311, the inverter(s) 312, and/or the grid of wires 3113 of FIG. 2B are only examples of the present disclosure, the present disclosure is not limited thereto. In addition, the skew sensing apparatus 100 may take its one or more inputs from a deliberate point (e.g., N3) of the grid wires 3113 or the outputs of the element 311 provided therein to have a minimal impact on the difference of arrival times of Clk1 and Clk2. The clock signal Clk1 provided to the third delay unit 330 through the element 311 may further be delayed through the third delay unit 330 by a third delay of (D+ΔtA) in response to the sensor control signal 231 and input to one input node N5 of the first skew sensor 20a. The clock signal Clk1 provided to the fifth delay unit 350 through the element 311 may further be delayed through the fifth delay unit 350 by a fifth delay of D and input to one input node N7 of the second skew sensor 20b. Although the delay unit 310 and the element 311 are illustrated being separated from each other as an example, the present disclosure is not limited thereto, for example, the delay unit 310 and the element 311 may be formed in an integrated circuit.

Referring back to FIG. 2A, in addition, the clock signal Clk2_in may be delayed through the second delay unit 320 by a second delay of (D+ΔtD) in response to the skew control signal 222, and provided to the fourth delay unit 340 and the sixth delay unit 360 via a node N4. In one embodiment, an element 312 including circuits or other structures may be disposed between the second delay unit 320 and the input of the skew sensing apparatus 100. The element 312 may be configured to distribute a clock signal, which corresponds to the clock signal Clk2, output from the delay unit 320 over various areas within the IC chip where the clock skew adjustment system 2 is applied. Although not shown in figures, for example, the element 312 may include, but is not limited to, a buffer(s), an inverter(s) and/or other circuit elements such as a grid of wires, similar to the element 311 of FIG. 2B. In addition, the skew sensing apparatus 100 may take its one or more inputs from a deliberate point (e.g., N4) of the grid wires or the outputs of the element 312 provided therein to have a minimal impact on the difference of arrival times of Clk1 and Clk2. The clock signal Clk2 provided to the fourth delay unit 340 through the element 312 may further be delayed through the fourth delay unit 340 by a fourth delay of D, and input to another input node N6 of the first skew sensor 20a. The clock signal Clk2 provided to the sixth delay unit 360 through the element 312 may further be delayed through the sixth delay unit 360 by a sixth delay of (D+ΔtB) in response to the sensor control signal 232, and input to another input node N8 of the second skew sensor 20b.

Hereinafter, the clock signals at the respective nodes N5 to N8, which are input nodes of the first and second skew sensors 20a and 20b, will be described with reference characters Clk1_DA, Clk2_D, Clk1_D, and Clk2_DB, respectively.

FIG. 2C illustrates a skew sensing apparatus of FIG. 2A according to a non-limiting exemplary embodiment of the present disclosure.

Referring to FIG. 2C, the skew sensing apparatus 100 may receive first and second clock signals Clk1 and Clk2 provided from the first and second delay units 310 and 320, respectively.

As described above with reference to FIG. 2A, the first skew sensor 20a may receive the clock signals Clk1_DA and Clk2_D via the nodes N5 and N6, respectively, and the second skew sensor 20b may receive the clock signals Clk1_D and Clk2_DB via the nodes N7 and N8, respectively.

For example, the clock signal Clk1_DA may be a delayed copy of the clock signal Clk1 by a delay of (D+ΔtA), such that T1_DA=T1+D+ΔtA, here T1_DA and T1 denote arrival times of the respective clock signals Clk1_DA and Clk1. The clock signal Clk1_D may be a delayed copy of the clock signal Clk1 by a delay of D, such that T1_D=T1+D, here T1_D denotes an arrival time of the clock signal Clk1_D. The clock signal Clk2_DB may be a delayed copy of the clock signal Clk2 by a delay of (D+ΔtB), such that T2_DB=T2+D+ΔtB, here T2_DB and T2 denote arrival times of the respective clock signals Clk2_DB and Clk2. The clock signal Clk2_D may be a delayed copy of the clock signal Clk2 by a delay of D, such that T2_D=T2+D, here T2_D denotes an arrival time of the clock signal Clk2_D.

Hereinafter, it is assumed that the clock signal Clk1 is earlier in time than the clock signal Clk2 for the purpose of illustration, however exemplary embodiments of the present disclosure are not limited thereto.

In an embodiment, each of the first and second skew sensors 20a and 20b may function to receive two clock signals and output either logic 1 L1 (e.g., logic high) or logic 0 L0 (e.g., logic low) depending on whether which one (e.g., a faster clock signal) of the received two clock signals is earlier than another (e.g., a slower clock signal).

For example, in an ideal case, if the faster clock signal (e.g., Clk1) is earlier than the slower clock signal (e.g., Clk2), each skew sensor 20a or 20b may output logic 1 L1, otherwise, each skew sensor 20a or 20b may output logic 0 L0.

However, as described above, in reality, there may exist an uncertainty region in each skew sensor 20a or 20b due to a sensor resolution S.

For example, when the clock signals Clk1_DA and Clk2_D are input to the first skew sensor 20a, the sensing output signal A_out of the first skew sensor 20a may be determined as shown in equations 1-3 below, depending on a clock skew (i.e., $\Delta T12 = T1-T2$) between the clock signals Clk1 and Clk2.

$A\_out = L0$ when $T1\_DA - T2\_D < -S$, $T1 + D + \Delta tA - T2 - D < -S$, or $T1 - T2 < -\Delta tA - S$      Equation 1:

$A\_out = L1$ when $T1\_DA - T2\_D \geq S$, $T1 + D + \Delta tA - T2 - D \geq S$, or $T1 - T2 \geq -\Delta tA + S$      Equation 2:

$A\_out =$ undeterministic state between $L1$ and $L0$ when $-S \leq T1\_DA - T2\_D < S$, $-S \leq T1 + D + \Delta tA - T2 - D < S$, $-\Delta tA - S \leq T1 - T2 < -\Delta tA + S$      Equation 3:

In addition, when the clock signals Clk1_D and Clk2_DB are input to the second skew sensor 20b, the sensing output signal B_out of the second skew sensor 20b may be determined as shown in equations 4-6 below, depending on the clock skew (i.e., $\Delta T12 = T1-T2$) between the clock signals Clk1 and Clk2.

$B\_out = L0$ when $T1\_D - T2\_DB < -S$, $T1 + D - T2 - D - \Delta tB < -S$, or $T1 - T2 < \Delta tB - S$      Equation 4:

$B\_out = L1$ when $T1\_D - T2\_DB \geq S$, $T1 + D - T2 - D - \Delta tB \geq S$, or $T1 - T2 \geq \Delta tB + S$      Equation 5:

$B\_out =$ undeterministic state between $L1$ and $L0$ when $-S \leq T1\_D - T2\_DB < S$, $-S \leq T1 + D - T2 - D - \Delta tB < S$, or $\Delta tB - S \leq T1 - T2 < \Delta tB + S$      Equation 6:

Table 2 shows the sensing output A_out of the first skew sensor 20a determined by Equations 1-3.

TABLE 2

| ΔT12 | A_out |
|---|---|
| ΔT12 < −ΔtA − S | L0 |
| −ΔtA − S ≤ ΔT12 < −ΔtA + S | Undeterministic state between L1 and L0 |
| ΔT12 ≥ −ΔtA + S | L1 |

Table 3 shows the output B_out of the second skew sensor 20b determined by Equations 4-6.

TABLE 3

| ΔT12 | B_out |
|---|---|
| ΔT12 < ΔtB − S | L0 |
| ΔtB − S ≤ ΔT12 < ΔtB + S | Undeterministic state between L1 and L0 |
| ΔT12 ≥ ΔtB + S | L1 |

Referring to Table 2, an uncertainty region (e.g., −ΔtA−S≤ΔT12<−ΔtA+S) of the first skew sensor 20a can be shifted by ΔtA toward an earlier time. Further, referring to table 3, an uncertainty region (e.g., ΔtB−S≤ΔT12<ΔtB+S) of the second skew sensor 20b can be shifted by ΔtB toward a later time.

Further, if the condition, i.e., −ΔtA+S<ΔtB−S (or 2*S<ΔtB+ΔtA), is met, time windows shown in tables 2 and 3 might not overlap each other, as shown in table 4 and FIG. 4.

Referring to table 4 and FIG. 4, when the clock skew ΔT12 is such that ΔT12<−ΔtA−S in a window of 41, both the A_out and the B_out may be logic 0s L0s. 0 L0 and the B_out may be logic 0 L0. When the clock skew ΔT12 is such that −ΔtA+S≤ΔT12<ΔtB−S in a window of 43, the A_out and the B_out may be logic 1 L1 and logic Further, when the clock skew ΔT12 is such that −ΔtA−S≤ΔT12<−ΔtA+S in a window of 42, the A_out may be undeterministic state between logic 1 L1 and logic 0 L0, respectively. When the clock skew ΔT12 is such that ΔtB−S≤ΔT12<ΔtB+S in a window of 44, the A_out may be logic 1 L1 and the B_out may be undeterministic state between logic 1 L1 and logic 0 L0. For ease of description, the windows 42, 43, and 44 may collectively be referred to as a window 46. When the clock skew ΔT12 is such that ΔT12≥ΔtB+S in a window of 45, both the A_out and the B_out may be logic 1s L1s.

TABLE 4

| ΔT12 | A_out | B_out |
|---|---|---|
| ΔT12 < −ΔtA − S | L0 | L0 |
| −ΔtA − S ≤ ΔT12 < −ΔtA + S | Undeterministic state between L1 and L0 | L0 |
| −ΔtA + S ≤ ΔT12 < ΔtB − S | L1 | L0 |
| ΔtB − S ≤ ΔT12 < ΔtB + S | L1 | Undeterministic state between L1 and L0 |
| ΔT12 ≥ ΔtB + S | L1 | L1 |

The clock skew controller 200 may receive the A_out and the B_out from the respective first and second skew sensors 20a and 20b and determine as to which of the windows 41 to 45 the clock skew ΔT12 belongs to, based on the received A_out and B_out. For example, the clock skew controller 200 may determine that the clock skew ΔT12 is within the window 46 when the A_out and the B_out are logic 1 L1 and logic 0 L0, respectively.

Further, in an embodiment, based on the received A_out and B_out, the clock skew controller 200 may be configured to provide the skew control signals 221 and 222 to the first and second delay units 310 and 320, respectively, and the clock skew controller 200 may be configured to provide the sensor control signals 231 and 232 to the third and sixth delay units 330 and 360.

Further, it is noted that a size of the window 46 may be controlled by changing settings of the delays of ΔtA and ΔtB.

When it is determined that the clock skew ΔT12 is within the window 46, the clock skew adjustment system 2 may stop the clock skew adjustment and enlarge the window 46 for long-term stability by changing the settings of the delays of ΔtA and ΔtB.

For example, the clock skew ΔT12 which can be achieved through the clock skew adjustment system 2 of FIG. 2A may be equal to or lower than max (|−ΔtA−S|, |ΔtB+S|).

Table 5 shows outputs A_out and B_out of the respective first and second skew sensors 20a and 20b when S=0.3 ps, and both ΔtA, and ΔtB are set to be 2.3 ps. This is only an example for the purpose of illustration, exemplary embodiments of the present disclosure are not limited thereto.

TABLE 5

| ΔT12 | A_out | B_out |
|---|---|---|
| ΔT12 < −2.9 ps | L0 | L0 |
| −2.9 ps ≤ ΔT12 < −2.3 ps | Undeterministic state between L1 and L0 | L0 |
| −2.3 ps ≤ ΔT12 < 2.3 ps | L1 | L0 |
| 2.3 ps ≤ ΔT12 < 2.9 ps | L1 | Undeterministic state between L1 and L0 |
| ΔT12 ≥ 2.9 ps | L1 | L1 |

The window 43 in the example of Table 5 may range from −2.3 ps to 2.3 ps with a size of 4.6 ps.

As described above, the clock skew controller 200 may dynamically control a size of the window 46 of the skew sensing apparatus 100 (or reduce or enlarge the window 46) by changing settings of the delays of ΔtA and ΔtB.

Thus, in an embodiment, the clock skew adjustment system 2 may reduce the window 46 to perform the clock skew adjustment in a first phase, and when the clock skew adjustment is completed (e.g., when the clock skew ΔT12 is within the window 46), the clock skew adjustment system 2 may stop the clock skew adjustment and enlarge the window 46 for long-term stability in a second phase. For example, in the first phase, the clock skew adjustment system 2 may reduce the window 46 to a first size S1, which is relatively small, before or during the clock adjustment, and, in the second phase, enlarge the window 46 to a second window size S2, which is relatively large or larger than the first size S1 after the completion of the clock skew adjustment. This may allow the system 2 to have a relatively wide clock skew adjustment range and reduce or prevent the clock jitter injected by switching the values of delay units 310 and/or 320 from occurring. Next, if the clock skew ΔT12 leaves the enlarged window 46 with the second size S2, the clock skew adjustment system 2 may begin again the clock skew adjustment of the first phase, as described above.

Since the clock skew adjustment is performed with the reduced window 46 with the first size S1, the clock skew ΔT12, during the second phase, may be anywhere within the enlarged window 46. This may allow the clock skew adjustment system (e.g., 2 of FIG. 2A) to have a certain margin within the enlarged window 46 which less likely triggers the readjustment of the clock skew, and thus, the jitter for the clock signals may be reduced.

Referring to FIGS. 3A and 3B, each of the first and second skew sensors 20a and 20b may include a phase detection unit 60 and a synchronization unit 70. The synchronization unit 70 may include a plurality of registers 71 to 73. Each of the registers 71 to 73 may be synchronized through a clock signal Clk_c and capable of storing one bit for holding information input thereto and outputting the stored bit in synchronization with the clock signal Clk_c. However, exemplary embodiments of the present disclosure are not limited thereto.

Figure 5A:
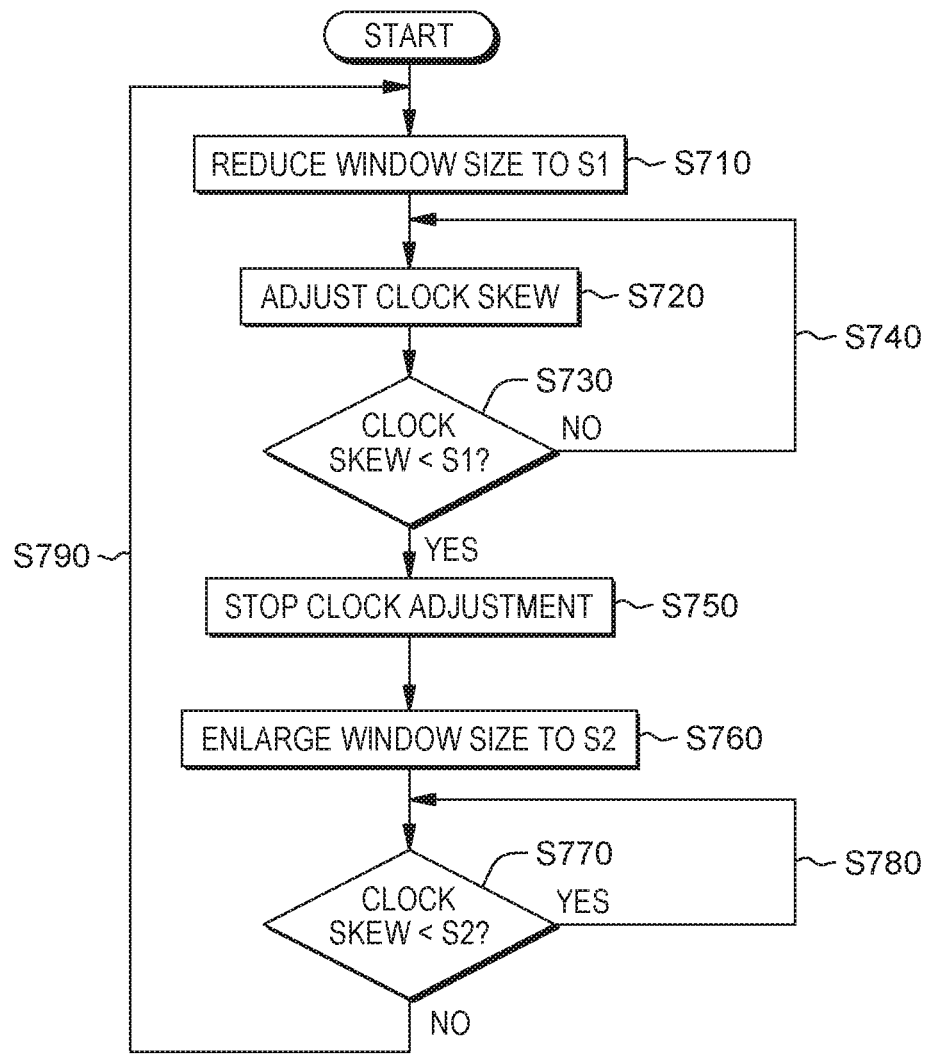
FIG. 5A illustrates a flow chart of a method for operating a clock skew adjustment system according to a non-limiting exemplary embodiment of the present disclosure.
Figure 5B:
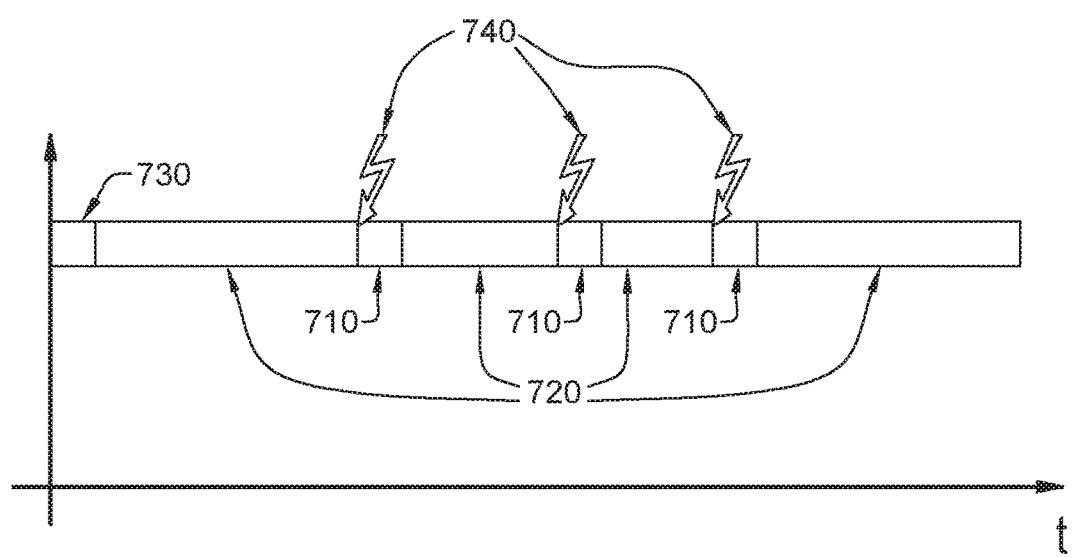
FIG. 5B illustrates clock skew adjustment periods and non-clock skew adjustment periods repeated in an alternate manner according to a non-limiting exemplary embodiment of the present disclosure.

FIG. 5A illustrates a flow chart of a method for operating a clock skew adjustment system 2 according to a non-limiting exemplary embodiment of the present disclosure. FIG. 5B illustrates clock skew adjustment periods and non-clock skew adjustment periods repeated in an alternate manner according to a non-limiting exemplary embodiment of the present disclosure.

Referring to FIG. 5A, a method according to an embodiment of the present disclosure may include: reducing (or minimizing) the window 46 to the first size S1 less than a predetermined value in an operation of S710; performing a clock skew adjustment with the reduced window 46 in an operation of S720; determining whether the adjusted clock skew ΔT12 is within the reduced window 46 of the first size S1 in an operation of S730; if the adjusted clock skew ΔT12 is out of the reduced window 46 (NO), further performing the clock skew adjustment using the reduced window 46 of the first size S1 in an operation of S740; and if the adjust clock skew ΔT12 is within the reduced window 46 of the first size S1 (YES), stopping the clock skew adjustment in an operation of S750 and enlarging the window 46 to a second size S2, which is greater than the first size S1, in an operation of S760. In an embodiment, the stopping of the clock skew adjustment may include providing the skew control signals 221 and 222 to make the clock signals Clk1_in and Clk2_in to have the skew ΔT12 found in operation of S710, S720, S730 and S740. The method further include: monitoring a value of the clock skew ΔT12 (not shown in FIG. 5A); determining whether the clock skew ΔT12 is within the enlarged window 46 of the second size S2 in an operation S770; if the clock skew ΔT12 is within the enlarged window 46 (YES), continuing to monitor the value of the clock skew ΔT12 in an operation of S780; and if the clock skew ΔT12 is out of the enlarged window 46 (NO), going back to the step S710 to perform again the above-described clock skew adjustment operations of S720 to S770. In an embodiment, the clock skew ΔT12 may leave the enlarged window 46 to trigger readjustment of the clock skew, due to: changes in physical parameters such as time, voltage, temperature, or the like; changes in workload and data traffic; and executed commands, etc.

In reducing the window 46 in the operation of S710, the clock skew controller 200 may control the settings of ΔtA and ΔtB to reduce the window 46 to the first size S1 using the sensor control signals 231 and 232, respectively.

Further, in performing the clock skew adjustment in the operation of S720, the third delay unit 330 may delay the clock signal Clk1 by a delay of (D+ΔtA) using the sensor control signal 231 to output the clock signal Clk1_DA, the fourth delay unit 340 may delay the clock signal Clk2 by a delay of D to output the clock signal Clk2_D, the fifth delay unit 350 may delay the clock signal Clk1 by a delay of D to output the clock signal Clk1_D, and the sixth delay unit 360 may delay the clock signal Clk2 by a delay of (D+AB) using the sensor control signal 232 to output the clock signal Clk2_DB; further the skew sensor 20a may output a sensing output signal A_out based on the clock signals Clk1_DA and Clk2_D received via nodes N5 and N6, respectively, and the skew sensor 20b may output a sensing output signal B_out based on the clock signals Clk1_D and Clk2_DB received via nodes N7 and N8, respectively.

Further, the clock skew controller may be configured to receive the sensing output signals A_out and B_out and determine which of the windows 41 to 45 the clock skew ΔT12 between the clock signals Clk1 and Clk2 belongs to, based on the received sensing output signals A_out and B_out.

For example, referring back to FIG. 4, when the A_out and the B_out are both logic 0s L0s for a certain predetermined period, the clock skew controller 200 may be configured to determine that the clock skew ΔT12 is within the window 41 or 42 and the clock signal Clk1 is later in arrival time than the clock signal Clk2, and may control the delays of ΔtC and ΔtD to be such that ΔtC<ΔtD using the skew control signals 221 and 222, respectively, to reduce the clock skew ΔT12. Further, when the A_out and the B_out are both logic 1s L1s for the certain predetermined period, the clock skew controller 200 may be configured to determine that the clock skew ΔT12 is within the window 44 or 45 and the clock signal Clk1 is earlier in arrival time than the clock signal Clk2, and may control the delays of ΔtC and ΔtD to be such that ΔtC>ΔtD using the skew control signals, 221 and 222, respectively.

In addition, when the A_out is randomly switching between logic 1 L1 and logic 0 L0 over time and the B_out is logic 0 L0 (or when A_out is logic 1 and B_out is randomly switching between logic 1 L1 and logic 0 L0 over time), the clock skew controller 200 may be configured to determine that the clock skew ΔT12 is within the window 42 (or the window 44) and may be able to determine the clock signals Clk1 is later than the clock signal Clk2 (or the clock signal Clk2 is earlier than the clock signal Clk1). In addition, when the A_out and the B_out are steadily logic 1 L1 and logic 0 L0 (or logic 0 L0 and logic 1 L1), respectively, the clock skew controller 200 may be configured to determine that the clock skew ΔT12 is within the window 43. When the clock skew controller 200 determines that the clock skew ΔT12 is within the windows 42, 43, and 44 (i.e., 46), it may stop the clock skew adjustment as the operation of S730 and S750 and enlarge the window 46 as the operation of S760.

Further, the clock skew controller 200 may be configured to determine whether the clock skew ΔT12 is within the enlarged window 46 of the second size S2 as the operation of S770, and if the clock skew ΔT12 is out of the enlarged window 46, the clock skew controller 200 is configured to control the settings of the delays of ΔtC and ΔtD and restart the operations S710 to S770.

Referring to FIG. 5B, the clock skew adjustment algorithm may begin with an initial clock skew adjustment period 730 which corresponds to the operations S710 and S720 of FIG. 5A, and repeat clock skew adjustment periods 710 each corresponding to the operation S710 of FIG. 5A and non-clock skew adjustment periods 720 each corresponding to the operations S750 and S760 of FIG. 5A in an alternate manner. Other than the initial clock skew adjustment period 730, the clock skew adjustment period 710 may be triggered in a period 740 corresponding to the operation S770 of FIG. 5A. The clock skew adjustment periods 710 and the non-clock skew adjustment periods 720 may vary in duration over time.

In an embodiment, the clock skew adjustment system 2 may reduce the window 46 to perform the clock skew adjustment in a first phase, and when the clock skew adjustment is completed (e.g., when the clock skew ΔT12 is within the window 46), the clock skew adjustment system 2 may stop the clock skew adjustment, wait for a predetermined period in a second phase, and start performing the clock skew adjustment in the first phase after the predetermined period. For example, the clock skew adjustment system 2 may reduce the window 46 to a first size S1, which is relatively small. This may allow the system 2 to reduce or prevent the clock jitter from occurring.

Figure 6:
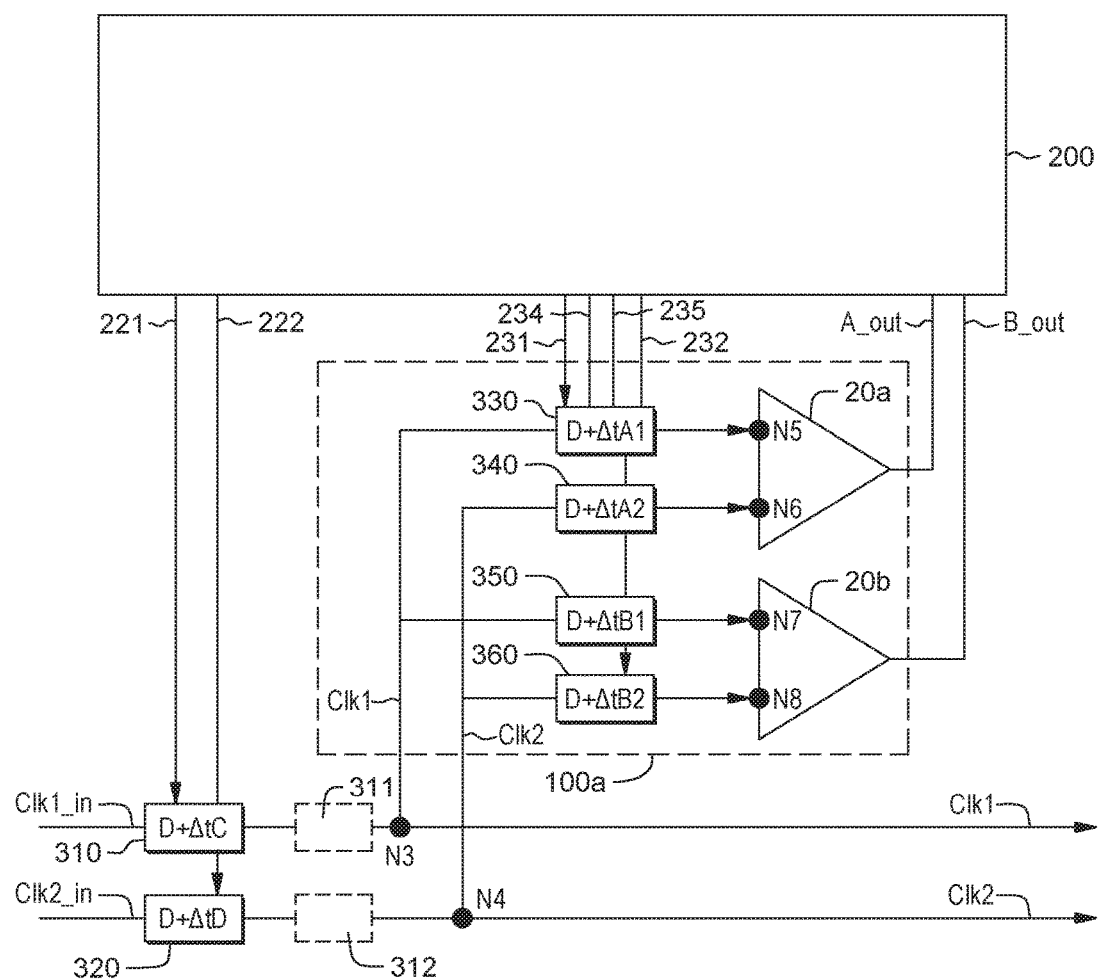
FIG. 6 illustrates a clock skew adjustment system according to a further non-limiting exemplary embodiment of the present disclosure.

FIG. 6 illustrates a clock skew adjustment system 3 according to a non-limiting exemplary embodiment of the present disclosure.

The clock skew adjustment system 3 of FIG. 6 has substantially the same configuration as the system 2 of FIG. 2A except that the fourth and fifth delay units 340 and 350 of FIG. 6 are further controlled using sensor control signals 233 and 234, respectively. For example, the clock skew controller 200 may further provide the sensor control signals 233 and 234 to control the delay units 340 and 350, respectively. Thus, the third to sixth delay units 330 to 360 and the skew sensors 20a and 20b constitutes a skew sensing apparatus 100a.

Referring to FIG. 6, the clock signal Clk1 may be provided to the third delay unit 330 and the fifth delay unit 350 via the node N3. The clock signal Clk1 provided to the third delay unit 330 may further be delayed through the third delay unit 330 by a delay of (D+ΔtA1) in response to the sensor control signal 231 and input to one input node N5 of the first skew sensor 20a. The clock signal Clk1 provided to the fifth delay unit 350 may further be delayed through the fifth delay unit 350 by a delay of (D+ΔtB1) in response to the sensor control signal 233 and input to one input node N7 of the second skew sensor 20b. In addition, the clock signal Clk2 may be provided to the fourth delay unit 340 and the sixth delay unit 360 via the node N4. The clock signal Clk2 provided to the fourth delay unit 340 may further be delayed through the fourth delay unit 340 by a delay of (D+ΔtA2) in response to the sensor control signal 234, and input to another input node N6 of the first skew sensor 20a. The clock signal Clk2 provided to the sixth delay unit 360 may further be delayed through the sixth delay unit 360 by a delay of (D+ΔtB2) in response to the sensor control signal 232, and input to another input node N8 of the second skew sensor 20b.

Thus, when the clock signals Clk1_DA1 and Clk2_DA2 respectively output from the third and fifth delay units 330 and 350 are input to the first skew sensor 20a, the sensing output signal A_out of the first skew sensor 20a may be determined as shown in equations 7-9 below, depending on a clock skew (i.e., ΔT12=T1−T2) between the clock signals Clk1 and Clk2.

A_out=L0 when $$T1-T2 < -(\Delta tA1-\Delta tA2)-S \quad \text{Equation 7:}$$

A_out=L1 when $$T1-T2 \geq -(\Delta tA1-\Delta tA2)+S \quad \text{Equation 8:}$$

A_out=undeterministic state between L1 and L0 when $$-(\Delta tA1-\Delta tA2)-S \leq T1-T2 < -(\Delta tA1-\Delta tA2)+S \quad \text{Equation 9:}$$

In addition, when the clock signals Clk1_DB1 and Clk2_DB2 respectively output from the fourth and sixth delay units 340 and 360 are input to the second skew sensor 20b, the sensing output signal B_out of the second skew sensor 20b may be determined as shown in equations 10-12 below, depending on a clock skew (i.e., ΔT12=T1−T2) between the clock signals Clk1 and Clk2.

B_out=L0 when $$T1-T2 < (\Delta tB2-\Delta tB1)-S \quad \text{Equation 10:}$$

B_out=L1 when $$T1-T2 \geq (\Delta tB2-\Delta tB1)+S \quad \text{Equation 11:}$$

B_out=undeterministic state between L1 and L0 when $$(\Delta tB2-\Delta tB1)-S \leq T1-T2 < (\Delta tB2-\Delta tB1)+S \quad \text{Equation 12:}$$

Further, if the condition, i.e., −(ΔtA1−ΔtA2)+S<(ΔtB2−ΔtB1)−S (or 2*S<(ΔtB2−ΔtB1)+(ΔtA1−ΔtA2)), is met, time windows shown expressed in equations 7-12 might not overlap each other, as shown in Table 5.

TABLE 5

| ΔT12 | A_out | B_out |
| --- | --- | --- |
| ΔT12 < −(ΔtA1 − ΔtA2) − S | L0 | L0 |
| −(ΔtA1 − ΔtA2) − S ≤ ΔT12 < −(ΔtA1 − ΔtA2) + S | Undeterministic state between L1 and L0 | L0 |
| −(ΔtA1 − ΔtA2) − S ≤ ΔT12 < (ΔtB2 − ΔtB1) − S | L1 | L0 |
| (ΔtB2 − ΔtB1) − S ≤ ΔT12 < (ΔtB2 − ΔtB1) + S | L1 | Undeterministic state between L1 and L0 |
| ΔT12 ≥ (ΔtB2 − ΔtB1) + S | L1 | L1 |

Thus, the window 43 where the A_out and the B_out are output logic 1 L1 and logic 0 L0, respectively, may range from −(ΔtA1−ΔtA2)−S and (ΔtB2−ΔtB1)−S.

Similar to the clock skew adjustment system 2 of FIG. 2A, the clock skew adjustment system 3 of FIG. 6 may perform a clock adjustment with a reduced size of the window 46, stop the clock skew adjustment when a clock skew ΔT12 is within the window 46, and increase the size of the window 46 for long-term stability.

It is noted that the window 43 formed by the clock skew adjustment system 3 may have a lower bound of −(ΔtA1−ΔtA2)−S and an upper bound of (ΔtB2−ΔtB1)−S. Since all of the four paths input to the first and second skew sensor 20a and 20b can be independently controlled in terms of delays, the above lower bound of −(ΔtA1−ΔtA2)−S and the upper bound of (ΔtB2−ΔtB1)−S may be arbitrary values, respectively. Thus, this may allow the system 3 to have the clock skew ΔT12 intentionally forced in a specific window range.

Although it is described with reference to FIGS. 2A and 6 that only two clock signals are input for a clock skew therebetween to be adjusted using the clock skew adjustment system (e.g., 2 or 3). However, exemplary embodiments of the present disclosure are not limited thereto. For example, the clock skew adjustment system according to an exemplary embodiment of the present disclosure can easily be extended for adjusting a clock skew between N clocks. N is an integer greater than one. In this case, at least, 2×(N−1) skew sensors may be required and the algorithm has to be extended accordingly. Here, "×" denotes multiplication.

Figure 7A:
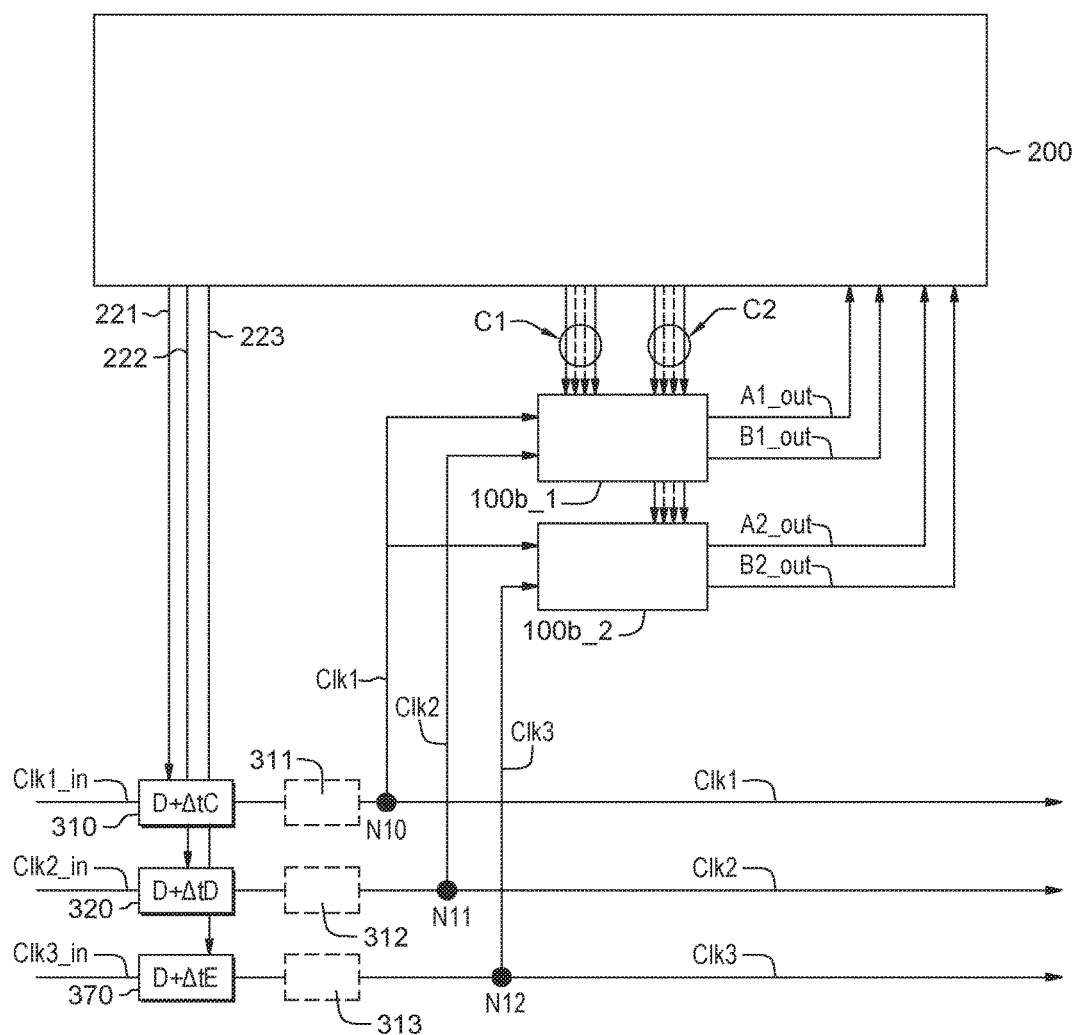
FIG. 7A illustrates a clock skew adjustment system according to a still further non-limiting exemplary embodiment of the present disclosure.
Figure 7B:
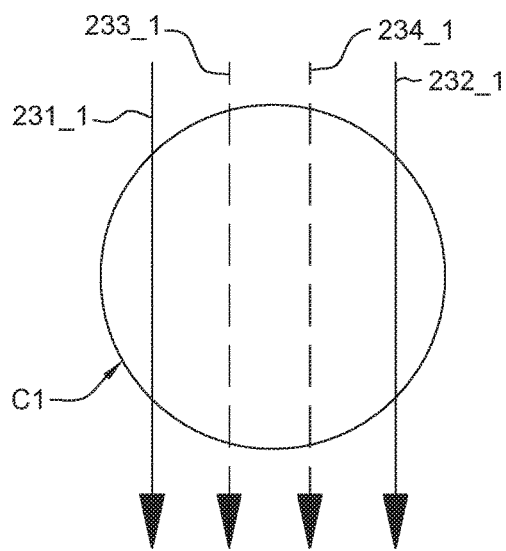
FIGS. 7B and 7C illustrate detailed sensor control signals generated from the clock skew controller 200 according to a non-limiting exemplary embodiment of the present disclosure.
Figure 7C:
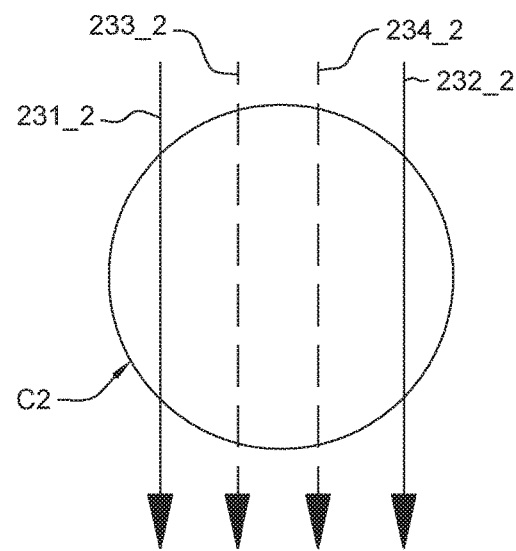

FIG. 7A illustrates a clock skew adjustment system 4 when the number of clock signals is three according to a still further non-limiting exemplary embodiment of the present disclosure. FIGS. 7B and 7C illustrate detailed sensor control signals generated from the clock skew controller 200 according to a non-limiting exemplary embodiment of the present disclosure.

The clock skew adjustment system 4 of FIG. 7A has substantially the same configuration as the system 2 of FIG. 2A or the system 3 of FIG. 6 except that a clock signal Clk3_in is further input to the system 4 for clock skew adjustment with the clock signals Clk1_in and Clk2_in and a skew sensing apparatus 100b_2 is additionally included.

Referring to FIG. 7A, each skew sensing apparatus 100b_1 or 100b_2 may correspond to the skew sensing apparatus 100 of FIG. 2A or the skew sensing apparatus 100a of FIG. 6. Thus, duplicate descriptions thereof will be omitted for the sake of simplicity.

Compared to the system 2 of FIG. 2A and the system 3 of FIG. 6, the clock skew adjustment system 4 may further include a delay unit 370, in addition to the delay units 310 and 320, for delay adjustment on the clock signal Clk3_in. The clock signal Clk3_in may be delayed through the delay unit 370 by a delay of (D+ΔtE) in response to a skew control signal 223, and the output clock signal Clk3 of the delay unit 370 may be provided to the skew sensing apparatus 100b_2. In addition, the clock signal Clk1_in may be delayed through the delay unit 310 by a delay of (D+ΔtC) in response to a skew control signal 221, and the output clock signal Clk1 of the delay unit 310 may be provided to the skew sensing apparatuses 100b_1 and 100b_2. Similarly, the clock signal Clk2_in may be delayed through the delay unit 320 by a delay of (D+ΔtD) in response to a skew control signal 222, and the output clock signal Clk2 of the delay unit 320 may be provided to the skew sensing apparatuses 100b_1. In one embodiment, the element 311 may be disposed between the delay unit 310 and each of the skew sensing apparatuses 100b_1 and 100b-2, the element 312 may be disposed between the delay unit 320 and the skew sensing apparatuses 100b_1, and an element 313 may be disposed between the delay unit 370 and the skew sensing apparatuses 100b_2. The element 311 may be configured to distribute a clock signal, which corresponds to the clock signal Clk1, output from the delay unit 310 over various areas within an IC chip where the clock skew adjustment system 4 is applied. In addition, the skew sensing apparatus 100b_1 (or 100b_2) may take its one or more inputs from a deliberate point (e.g., N10) of the grid wires to have a minimal impact on the difference of arrival times of the clock signals Clk1, Clk2, and Clk3. The element 312 may be configured to distribute a clock signal, which corresponds to the clock signal Clk2, output from the delay unit 320 over various areas within the IC chip where the clock skew adjustment system 4 is applied. In addition, the skew sensing apparatus 100b_1 may take its one or more inputs from a deliberate point (e.g., N11) of the grid wires to have a minimal impact on the difference of arrival times of the clock signals Clk1, Clk2, and Clk3. The element 313 may be configured to distribute a clock signal, which corresponds to the clock signal Clk3, output from the delay unit 370 over various areas within the IC chip where the clock skew adjustment system 4 is applied. In addition, the skew sensing apparatus 100b_2 may take its one or more inputs from a deliberate point (e.g., N12) of the grid wires to have a minimal impact on the difference of arrival times of the clock signals Clk1, Clk2, and Clk3.

Although not shown in figures, for example, the element 313 may include, but are not limited to, a buffer(s), an inverter(s) and/or other circuit elements such as a grid of wires, similar to the element 311 of FIG. 2B.

In one embodiment, the sensor control signals for each skew sensing apparatus 100b_1 or 100b_2 may be two in number when the skew sensing apparatus 100b_1 or 100b_2 is implemented with the apparatus 100 of FIG. 2A. Thus, in this case, the sensor control signals 231_1 and 232_1 may be provided to the skew sensing apparatus 100b_1 and the sensor control signals 231_2 and 232_2 may be provided to the skew sensing apparatus 100b_2, referring to portions C and C2 of FIGS. 7A to 7C.

In one embodiment, the sensor control signals for each skew sensing apparatus 100b_1 or 100b_2 may be four in number when the skew sensing apparatus 100b_1 or 100b_2 is implemented with the apparatus 100a of FIG. 6. Thus, in this case, the sensor control signals 231_1 to 234_1 may be provided to the skew sensing apparatus 100b_1 and the sensor control signals 231_2 to and 234_2 may be provided to the skew sensing apparatus 100b_2, referring to portions C and C2 of FIGS. 7A to 7C.

Further, the skew sensing apparatus 100b_1 may provide sensing outputs A1_out and B1_out to the clock skew controller 200. Similarly, the skew sensing apparatus 100b_2 may provide sensing outputs A2_out and B2_out to the clock skew controller 200.

Since each of the skew sensing apparatuses 100b_1 and 100b_2 has two skew sensors (e.g., 20a and 20b), the number of skew sensors for adjusting a clock skew between three clocks is four (e.g., 2×(N−1)=4 when N is 3). The clock skew adjustment system 4 of FIG. 7A is only one example for showing as to how a clock skew adjustment system can be extended as the number of clock signals increases, however exemplary embodiments of the present disclosure are not limited thereto.

Figure 8:
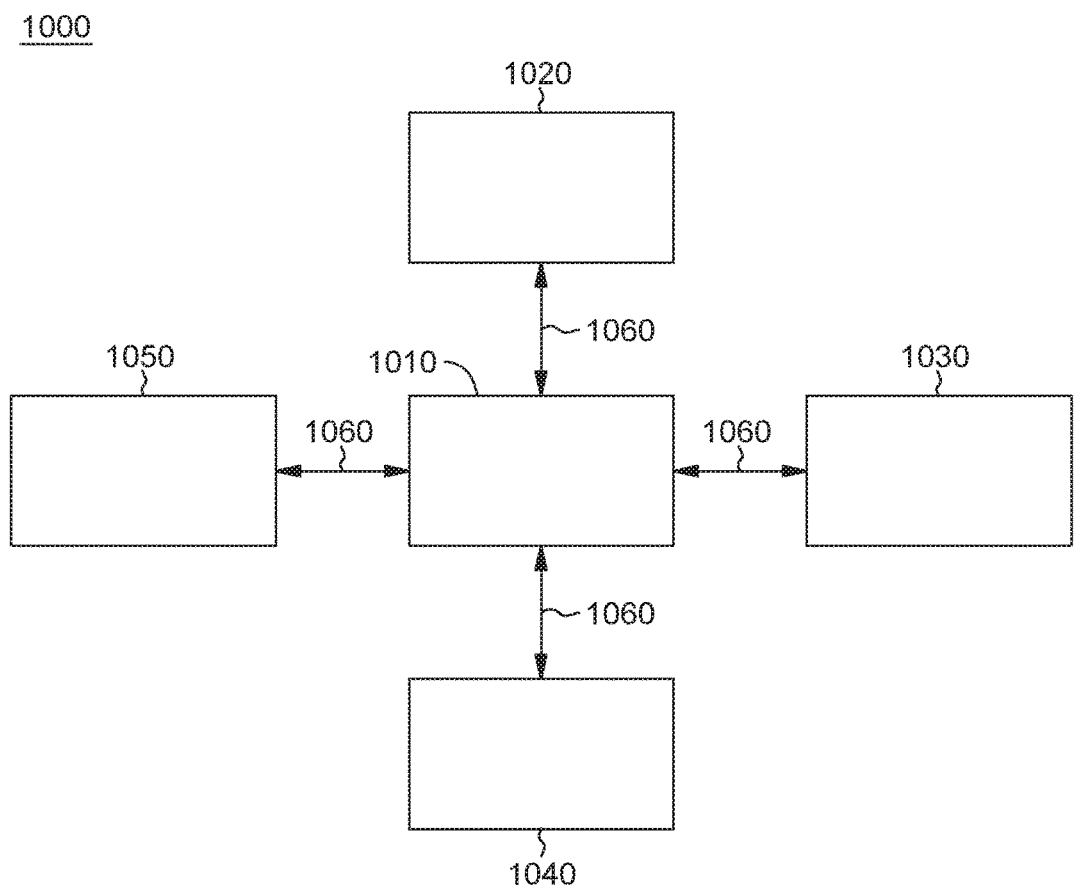
FIG. 8 is a block diagram of a computing system according to a non-limiting exemplary embodiment of the present disclosure.

FIG. 8 is a block diagram of a computing system 1000 according to a non-limiting exemplary embodiment of the present disclosure.

Referring to FIG. 8, the computing system 1000 may be used as a platform for the clock skew controller 200 FIG. 2A, FIG. 6, or FIG. 7A.

In addition, the computing system 1000 may be implemented with a ultra-mobile personal computer (UMPC), a net-book, a personal digital assistance (PDA), a portable computer (PC), a web tablet, a wireless phone, a mobile phone, a smart phone, an e-book, a portable multimedia player (PMP), a portable game console, a navigation device, a black box, a digital camera, a digital multimedia broadcasting (DMB) player, a digital audio recorder, a digital audio player, a digital picture recorder, a digital picture player, a digital video recorder, a digital video player, or the like.

Referring to FIG. 8, the computing system 1000 may include a processor 1010, I/O devices 1020, a memory system 1030, a display device 1040, and a network adaptor 1050.

The processor 1010 may drive the I/O devices 1020, the memory system 1030, the display device 1040, and the network adaptor 1050 through a bus 1060.

The computing system 1000 may include a program module for performing the functions or operations described hereinabove with respect to the clock skew adjustment systems 2 to 4 of respective FIG. 2A, FIG. 6, and FIG. 7A, or the method of FIG. 5A according to exemplary embodiments. For example, the program module may include routines, programs, objects, components, logic, data structures, or the like, for performing particular tasks or implement particular abstract data types. The processor (e.g., 1010) of the computing system 1000 may execute instructions written in the program module to perform the functions or operations described with respect to the clock skew adjustment systems 2 to 4 of respective FIG. 2A, FIG. 6, and FIG. 7A, or the method of FIG. 5A. The program module may be programmed into the integrated circuits of the processor (e.g., 1010). In an exemplary embodiment, the program module may be stored in the memory system (e.g., 1030) or in a remote computer system storage media.

The computing system 1000 may include a variety of computing system readable media. Such media may be any available media that is accessible by the computer system (e.g., 1000), and it may include both volatile and non-volatile media, removable and non-removable media.

The memory system (e.g., 1030) can include computer system readable media in the form of volatile memory, such as random access memory (RAM) and/or cache memory or others. The computer system (e.g., 1000) may further include other removable/non-removable, volatile/non-volatile computer system storage media.

The computer system (e.g., 1000) can communicate with one or more devices using the network adapter (e.g., 1050). The network adapter may support wired communications based on Internet, local area network (LAN), wide area network (WAN), or the like, or wireless communications based on code division multiple access (CDMA), global system for mobile communication (GSM), wideband CDMA, CDMA-2000, time division multiple access (TDMA), long term evolution (LTE), wireless LAN, Bluetooth, or the like.

Exemplary embodiments of the present disclosure may include a system, a method, and/or a computer program product. The computer program product may include a non-transitory computer readable storage medium (e.g., the memory system 1030) having computer readable program instructions thereon for causing a processor to carry out aspects of the present disclosure.

The computer readable storage medium can be a tangible device that can retain and store instructions for use by an instruction execution device. The computer readable storage medium may be, for example, but not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, or the like, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to the computing system 1000 from the computer readable storage medium or to an external computer or external storage device via a network. The network may include copper transmission cables, optical transmission fibers, wireless transmission, routers, firewalls, switches, gateway computers and/or edge servers. A network adapter card (e.g., 1050) or network interface in each computing/processing device receives computer readable program instructions from the network and forwards the computer readable program instructions for storage in a computer readable storage medium within the computing system.

Computer readable program instructions for carrying out operations of the present disclosure may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the computing system (e.g., 1000) through any type of network, including a LAN or a WAN, or the connection may be made to an external computer (for example, through the Internet using an Internet Service Provider). In an exemplary embodiment, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present disclosure.

Aspects of the present disclosure are described herein with reference to flowchart illustrations and/or block diagrams of methods, device, and computer program products. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present disclosure. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements, if any, in the claims below are intended to include any structure, material, or act for performing the function in combination with other claimed elements as specifically claimed. The description of the present disclosure has been presented for purposes of illustration and description, but is not intended to be exhaustive or limited to the present disclosure in the form disclosed. Many modifications and variations will be apparent to those of ordinary skill in the art without departing from the scope and spirit of the present disclosure. The embodiment was chosen and described in order to best explain the principles of the present disclosure and the practical application, and to enable others of ordinary skill in the art to understand the present disclosure for various embodiments with various modifications as are suited to the particular use contemplated.

While the present disclosure has been particularly shown and described with respect to preferred embodiments thereof, it will be understood by those skilled in the art that the foregoing and other changes in forms and details may be made without departing from the spirit and scope of the present disclosure. It is therefore intended that the present disclosure not be limited to the exact forms and details described and illustrated, but fall within the scope of the appended claims.

What is claimed is:

1. An apparatus of performing a clock skew adjustment between at least first and second clock signals, comprising:
   a first skew sensor configured to receive a third clock signal obtained by delaying the first clock signal by a first delay and a fourth clock signal obtained by delaying the second clock signal by a second delay, and to generate first information based on the third and fourth clock signals, the first information varying depending on a clock skew between the first and second clock signals;
   a second skew sensor configured to receive a fifth clock signal obtained by delaying the first clock signal by a third delay and a sixth clock signal obtained by delaying the second clock signal by a fourth delay, and to generate second information based on the fifth and sixth clock signals, the second information varying depending on the clock skew between the first and second clock signals; and
   a clock skew controller configured to perform the clock skew adjustment based on the first and second information,
   wherein when the clock skew is within a first window ranging from $(-\Delta tA-S)$ and $(\Delta tB+S)$, the clock skew controller is configured to stop the skew adjustment, where $\Delta tA$ corresponds to a difference between the first and second delays, $\Delta tB$ corresponds to a difference between the third and fourth delays, and S is a sensing resolution of each of the first and second skew sensors, and wherein said clock skew controller performs the clock skew adjustment in an initial first clock skew adjustment period and in subsequent clock skew adjustment periods.

2. The apparatus of claim 1, further comprising: a first delay unit configured to delay the first clock signal by the first delay in response to a first sensor control signal provided by the clock skew controller, and to output the delayed first clock signal as the third clock signal; a second delay unit configured to delay the second clock signal by the second delay, and to output the delayed second clock signal as the fourth clock signal; a third delay unit configured to delay the first clock signal by the third delay, and to output the delayed first clock signal as the fifth clock signal; and a fourth delay unit configured to delay the second clock signal by the fourth delay in response to a second sensor control signal provided by the clock skew controller, and to output the delayed second clock signal as the sixth clock signal; a fifth delay unit configured to delay the first clock signal by a fifth delay in response to a first skew control signal provided by the clock skew controller; and a sixth delay unit configured to delay the second clock signal by a sixth delay in response to a second skew control signal provided by the clock skew controller.

3. The apparatus of claim 1, wherein when the clock skew is within a first window, the clock skew controller stops the skew adjustment, and
   wherein the clock skew controller controls a size of the first window using the first and fourth delays.

4. The apparatus of claim 3, wherein the apparatus is configured to adjust the clock skew by reducing the first window to a first size less than a predetermined value, and when the adjusted clock skew is within the reduced first window, the apparatus is configured to stop the skew adjustment and, after stopping, is configured to enlarge the first window to a second size, wherein the apparatus enlarges the first window to a second size in a non-clock skew adjustment period, said clock skew adjustment period and non-clock skew adjustment period being repeated in an alternating manner.

5. The apparatus of claim 4, wherein when the clock skew leaves the enlarged first window, the clock skew controller reduces the first window to the first size using the first and fourth delays to readjust the clock skew.

6. The apparatus of claim 3, wherein the clock skew controller determines that the clock skew is within the first window when the first information corresponds to a logic high and the second information corresponds to a logic low.

7. The apparatus of claim 4, wherein the alternately repeating said clock skew adjustment period and non-clock skew adjustment period vary in duration over time.

8. A method for adjusting a clock skew between at least first and second clock signals, comprising: receiving, by a first skew sensor, third and fourth clock signals, wherein the third clock signal is obtained by delaying the first clock signal by a first delay and the fourth clock signal is obtained by delaying the second clock signal by a second delay; receiving, by a second skew sensor, fifth and sixth clock signals, wherein the fifth clock signal is obtained by delaying the first clock signal by a third delay and the sixth clock signal is obtained by delaying the second clock signal by a fourth delay; generating, by the first skew sensor, first information based on the third and fourth clock signals, wherein the first information varies depending on a clock skew between the first and second clock signals; generating, by the second skew sensor, second information based on the fifth and sixth clock signals, wherein the second information varies depending on the clock skew between the first and second clock signals; and performing the clock skew adjustment based on the first and second information, and stopping, by a clock skew controller, the clock skew adjustment when the clock skew is within a first window ranging from $(-\Delta tA-S)$ and $(\Delta tB+S)$, where $\Delta tA$ corresponds to a difference between the first and second delays, $\Delta tB$ corresponds to a difference between the third and fourth delays, and S is a sensing resolution of each of the first and second skew sensors, and wherein said clock skew adjustment is performed in an initial first clock skew adjustment period and in subsequent clock skew adjustment periods.

9. The method of claim 8, further comprising:
reducing a target clock skew window to a first size less than a predetermined value in the initial first clock skew adjustment period;
adjusting the clock skew between the first and second clock signals based on the first and second information;
determining whether the adjusted clock skew is within the reduced target clock skew window;
stopping the adjusting of the clock skew when the adjusted clock skew is determined to be within the reduced target clock skew window; and
readjusting the clock skew when the adjusted clock skew is determined to be out of the reduced target clock skew window, the reducing the target clock skew window, clock skew adjusting, adjusted clock skew determining and the stopping the clock skew adjusting are repeated in said subsequent clock skew adjustment periods.

10. The method of claim 9, further comprising:
enlarging, in a non-clock skew adjustment period, the target clock skew window to a second size more than the first size when stopping the adjusting of the clock skew;
determining whether the adjust clock skew is within the enlarged target clock skew window;
reducing the target clock skew window to the first size to restart the adjusting of the clock skew, and
repeating the enlarging the target clock skew window, the adjusted clock skew determining, and the reducing the target clock skew window in subsequent non-clock skew adjustment periods.

11. The method of claim 10, further comprising repeating said clock skew adjustment periods and non-clock skew adjustment periods in an alternating manner.

12. The method of claim 8, further comprising:
receiving the first and second clock signals;
delaying the first clock signal by the first delay to obtain the third clock signal in response to a first sensor control signal;
delaying the second clock signal by the fourth delay to obtain the sixth clock signal in response to a second sensor control signal;
delaying the first clock signal by a fifth delay in response to a first skew control signal; and
delaying the second clock signal by a sixth delay in response to a second skew control signal,
wherein the first skew control signal, the second skew control signal, the first sensor control signal, and the second sensor control signal are generated based on the first and second information.

13. The method of claim 9, wherein a size of the target clock skew window is controlled using the first and fourth delays.

14. The method of claim 13, wherein the determining whether the adjusted clock skew is within the target clock skew window includes determining that the clock skew is within the target clock skew window when the first information corresponds to a logic high and the second information corresponds to a logic low.

15. The method of claim 8, further comprising: enlarging, using the clock skew controller, the first window after the stopping of the skew adjustment.

16. A computer program product stored in a non-transitory computer-readable storage medium having computer readable program instructions, the computer readable program instructions read and carried out by a processing device for performing a method of adjusting a clock skew between at least first and second clock signals, wherein the method comprises: receiving, by a first skew sensor, third and fourth clock signals, wherein the third clock signal is obtained by delaying the first clock signal by a first delay and the fourth clock signal is obtained by delaying the second clock signal by a second delay; receiving, by a second skew sensor, fifth and sixth clock signals, wherein the fifth clock signal is obtained by delaying the first clock signal by a third delay and the sixth clock signal is obtained by delaying the second clock signal by a fourth delay; generating, by the first skew sensor, first information based on the third and fourth clock signals, wherein the first information varies depending on a clock skew between the first and second clock signals; generating, by the second skew sensor, second information based on the fifth and sixth clock signals, wherein the second information varies depending on the clock skew between the first and second clock signals; and performing the clock skew adjustment based on the first and second information, and stopping, by a clock skew controller, the clock skew adjustment when the clock skew is within a first window ranging from $(-\Delta tA-S)$ and $(\Delta tB+S)$, where $\Delta tA$ corresponds to a difference between the first and second delays, $\Delta tB$ corresponds to a difference between the third and fourth delays, and S is a sensing resolution of each of the first and second skew sensors, and wherein said clock skew adjustment is performed in an initial first clock skew adjustment period and in subsequent clock skew adjustment periods.

17. The computer product of claim 16, wherein the method further comprises:
reducing a target clock skew window to a first size less than a predetermined value in the initial first clock skew adjustment period;
adjusting the clock skew between the first and second clock signals based on the first and second information;
determining whether the adjusted clock skew is within the reduced target clock skew window;
stopping the adjusting of the clock skew when the adjusted clock skew is determined to be within the reduced target clock skew window; and
readjusting the clock skew when the adjusted clock skew is determined to be out of the reduced target clock skew window, the reducing the target clock skew window, the clock skew adjusting, the adjusted clock skew determining and the stopping the clock skew adjusting are repeated in said subsequent clock skew adjustment periods.

18. The computer product of claim 16, wherein the method further comprising:
   enlarging in a non-clock skew adjustment period, the target clock skew window to a second size more than the first size when stopping the adjusting of the clock skew;
   determining whether the adjust clock skew is within the enlarged target clock skew window;
   reducing the target clock skew window to the first size to restart the adjusting of the clock skew, and
   repeating the enlarging the target clock skew window, the adjusted clock skew determining, and the reducing the target clock skew window in subsequent non-clock skew adjustment periods.

19. The computer product of claim 18, further comprising repeating said clock skew adjustment periods and non-clock skew adjustment periods in an alternating manner.

20. The computer product of claim 15, wherein the method further comprising:
   receiving the first and second clock signals;
   delaying the first clock signal by the first delay to obtain the third clock signal in response to a first sensor control signal;
   delaying the second clock signal by the fourth delay to obtain the sixth clock signal in response to a second sensor control signal;
   delaying the first clock signal by a fifth delay in response to a first skew control signal; and
   delaying the second clock signal by a sixth delay in response to a second skew control signal.

* * * * *